(12) United States Patent  
Tang et al.

(10) Patent No.: US 7,423,899 B2
(45) Date of Patent: Sep. 9, 2008

(54) SRAM DEVICE HAVING FORWARD BODY BIAS CONTROL

(75) Inventors: Stephen H. Tang, Pleasanton, CA (US); Muhammad M. Khellah, Lake Oswego, OR (US); Dinesh Somasekhar, Portland, OR (US); Yibin Ye, Portland, OR (US); Vivek K. De, Beaverton, OR (US); James W. Tschanz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/812,894

(22) Filed: Mar. 31, 2004

(65) Prior Publication Data

US 2005/0226032 A1    Oct. 13, 2005

(51) Int. Cl.
*G11C 11/00*    (2006.01)
*G11C 5/14*    (2006.01)

(52) U.S. Cl. .................. 365/154; 365/156; 365/226; 365/227

(58) Field of Classification Search .............. 365/154, 365/156, 226, 227, 104; 327/534
See application file for complete search history.

(56) References Cited

U.S. PATENT DOCUMENTS

| | | | | |
|---|---|---|---|---|
| 4,567,577 A * | 1/1986 | Oliver | .......................... | 365/156 |
| 4,901,285 A * | 2/1990 | Sano et al. | .................... | 365/104 |
| 5,365,475 A * | 11/1994 | Matsumura et al. | .......... | 365/154 |
| 5,706,226 A * | 1/1998 | Chan et al. | ................... | 365/156 |
| 5,726,562 A * | 3/1998 | Mizuno | ....................... | 365/156 |
| 5,726,944 A * | 3/1998 | Pelley et al. | ................. | 365/226 |
| 5,744,844 A | 4/1998 | Higuchi | | |
| 5,986,924 A * | 11/1999 | Yamada | ....................... | 365/154 |
| 6,240,009 B1 | 5/2001 | Naffziger et al. | | |
| 6,301,146 B1 * | 10/2001 | Ang et al. | ..................... | 365/154 |
| 6,331,947 B1 * | 12/2001 | Widdershoven et al. | ..... | 365/154 |
| 6,510,088 B2 * | 1/2003 | Chen et al. | .................... | 365/154 |
| 6,556,471 B2 * | 4/2003 | Chappell et al. | ............. | 365/154 |
| 6,593,799 B2 * | 7/2003 | De et al. | ...................... | 327/534 |
| 6,621,727 B2 * | 9/2003 | Chen | ............................ | 365/156 |
| 6,643,199 B1 | 11/2003 | Tang et al. | | |
| 6,678,202 B2 * | 1/2004 | Scott | ........................... | 365/154 |
| 6,707,702 B1 * | 3/2004 | Komatsuzaki | ............... | 365/145 |
| 6,714,439 B2 * | 3/2004 | Kobayashi et al. | .......... | 365/154 |
| 6,724,648 B2 * | 4/2004 | Khellah et al. | ............... | 365/154 |
| 6,788,566 B1 * | 9/2004 | Bhavnagarwala et al. | ... | 365/154 |
| 6,795,332 B2 * | 9/2004 | Yamaoka et al. | ............ | 365/154 |
| 6,985,380 B2 * | 1/2006 | Khellah et al. | ............... | 365/156 |
| 2002/0171655 A1 | 11/2002 | Lavelle et al. | | |
| 2003/0002328 A1 | 1/2003 | Yamauchi | | |
| 2003/0112687 A1 | 6/2003 | Tang | | |
| 2003/0147275 A1 | 8/2003 | Chang | | |

* cited by examiner

*Primary Examiner*—Trong Phan
(74) *Attorney, Agent, or Firm*—Ked & Associates, LLP

(57) ABSTRACT

A SRAM device is provided having a plurality of memory cells. Each memory cell may include a plurality of transistors coupled in a cross-coupled inverter configuration. An NMOS transistor may be coupled to a body of the two PMOS transistors in the cross-coupled inverter configuration so as to apply a forward body bias to the PMOS transistors of the cross-coupled inverter configuration. A power control unit may control a supply voltage to each of the PMOS transistors as well as apply the switching signal to the NMOS transistor based on a STANDBY mode of the memory cell.

25 Claims, 4 Drawing Sheets

SRAM DEVICE HAVING FORWARD BODY BIAS CONTROL

FIELD

Embodiments of the present invention may relate to circuit design. More particularly, embodiments of the present invention may relate to memory circuits such as static random access memories (SRAMs).

BACKGROUND

Power is a problem with most electronic systems and in particular with memory systems. The continued scaling of CMOS technology has caused standby power dissipation of SRAMs to become an increasing problem. Six transistor (6T) SRAMs are considered one of the lowest power CMOS circuits and thus power loss is particularly important in these devices.

As larger and larger caches are integrated on a same die, the total transistor width allocated to cache increases. At the same time, the transistor leakage per unit width increases with the scaling of technology. Accordingly, the cache is consuming a larger and larger percentage of power.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1:
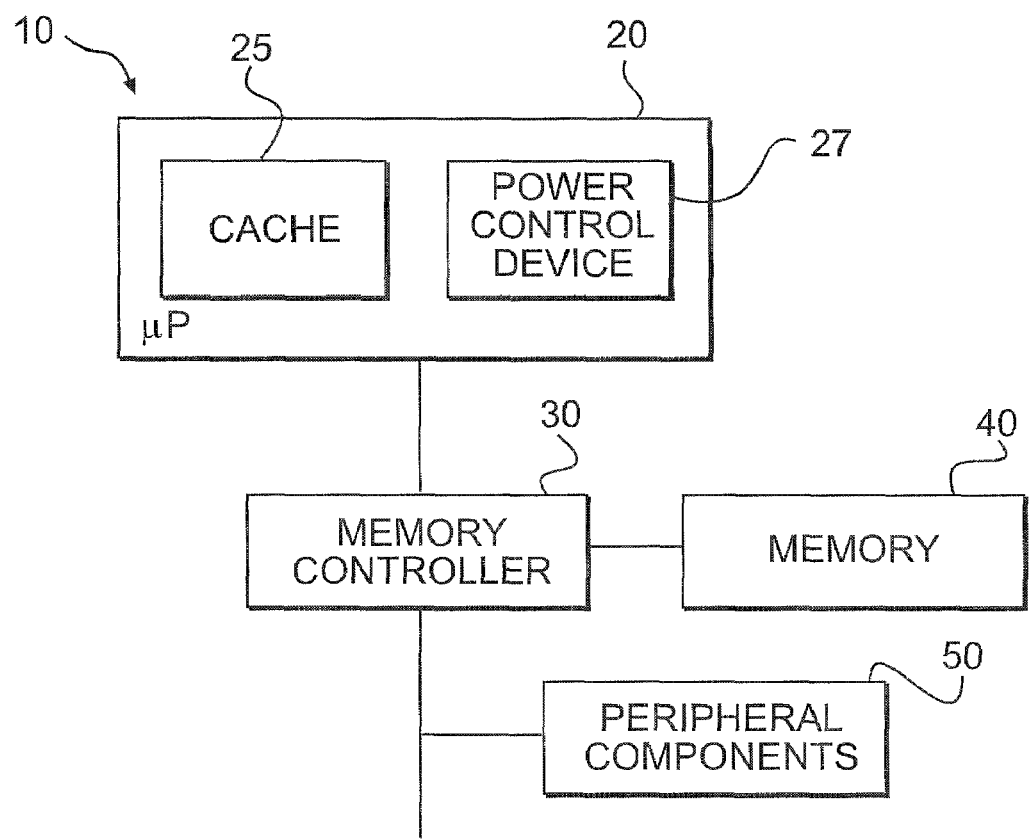
FIG. 1 is a block diagram of a computer system according to an example arrangement.

In the following detailed description, like reference numerals and characters may be used to designate identical, corresponding or similar components in differing figure drawings. Further, in the detailed description to follow, example sizes/models/values/ranges may be given although embodiments of the present invention are not limited to the same. Well-known power/ground connections to integrated circuits (ICs) and other components may not be shown within the FIGs. for simplicity of illustration and discussion. Further, arrangements and embodiments may be shown in block diagram form in order to avoid obscuring the invention, and also in view of the fact that specifics with respect to implementation of such block diagram arrangements may be dependent upon the platform within which the present invention is to be implemented. That is, the specifics may be well within the purview of one skilled in the art. Where specific details are set forth in order to describe example embodiments of the invention, it should be apparent to one skilled in the art that embodiments of the present invention can be practiced without these specific details.

Embodiments of the present invention may be described with respect to a STANDBY mode (or state). The terminology STANDBY mode may also be called INACTIVE or UNACCESSED, for example. This mode or state may relate to an actual or a desired state or mode of the memory device (or portions of the memory device).

FIG. 1 is a block diagram of a computer system according to an example arrangement. Other arrangements and configurations are also possible. More specifically, FIG. 1 shows a computer system 10 that includes a microprocessor 20, a memory controller 30, a memory 40 and peripheral components 50. The microprocessor 20 includes a cache 25 that may be part of a memory hierarchy to store instructions and data, where the system memory 40 may be part of the memory hierarchy. Communication between the microprocessor 20 and the memory 40 may be facilitated by the memory controller (or chipset) 30, which may also facilitate in communicating with the peripheral components 50. The microprocessor 20 may also include a power control device 27 to control power management within the microprocessor 20.

Figure 2:
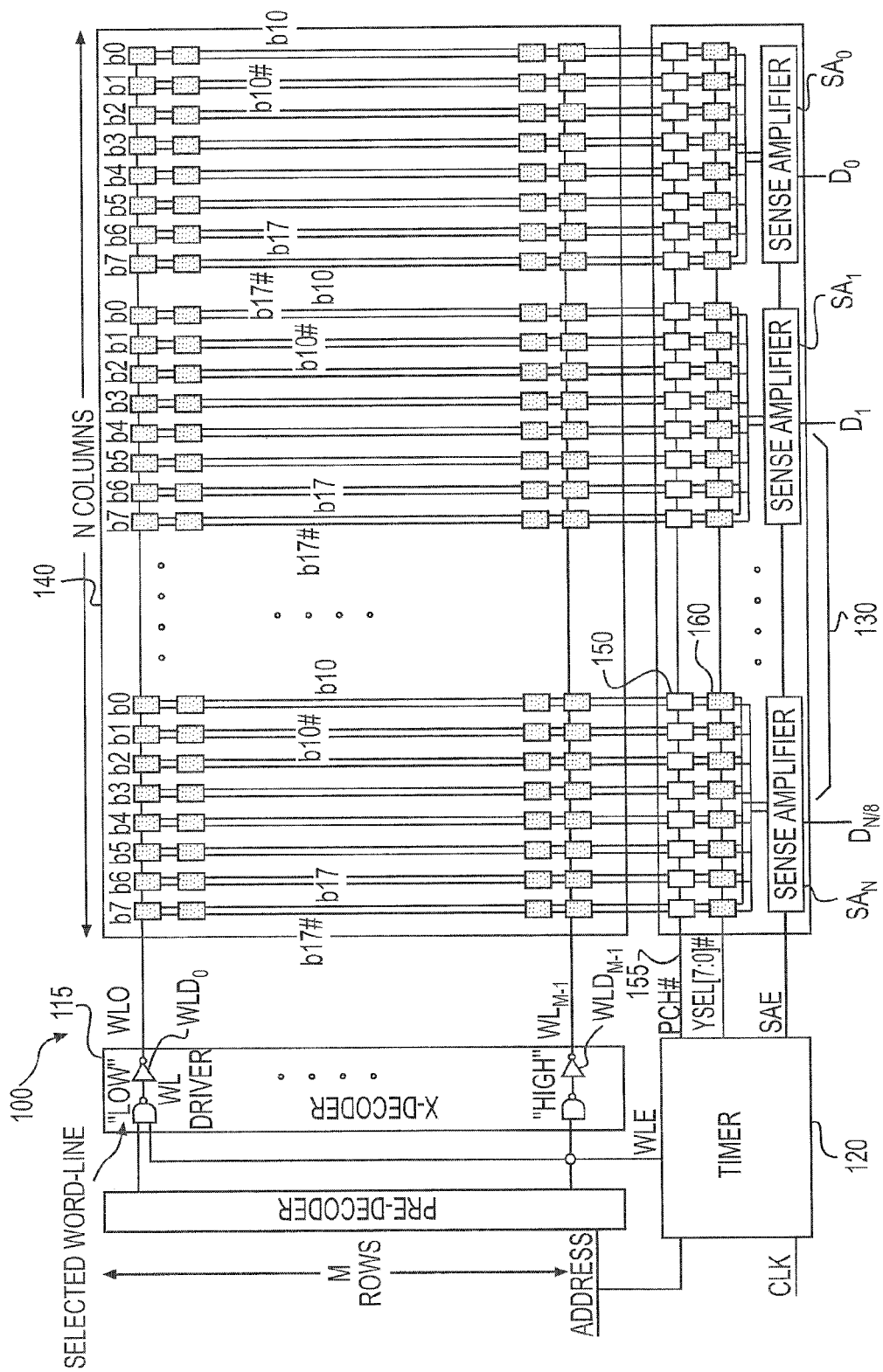
FIG. 2 is a diagram of a SRAM device according to an example arrangement.

FIG. 2 is a diagram of a SRAM device according to an example arrangement. Other arrangements and configurations are also possible. More specifically, the SRAM device 100 includes a memory array (M rows and N columns) 140 of memory cells. The SRAM device 100 may also include a row decoder 115, a timer device 120 and I/O devices (or I/O outputs) 130. Bits of the same memory word may be separated from each other for efficient IO design. In this example arrangement, each of the N columns corresponds with 8 bit lines (or 8 bit-pairs). For example, each column includes bit lines b0 b1, b2, b3, b4, b5, b6 and b7. Each of the bit lines includes a bit line pair. For example, bit line b0 includes bit line pair b10 and b10#. Also, bit line b7 includes bit line pairs b17 and b17#. The other bit line pairs are not labeled in FIG. 2 for ease of illustration. A plurality of sense-amplifiers $SA_{0-n}$ ($n=(N/8)-1$) may also be provided such that each group of eight columns may share a single sense amplifier SA. An 8-to-1 multiplexer (MUX) (not shown) may be used to connect each column to the SA during a READ operation. Another 8-to-1 MUX (not shown) may be used to connect each column to a write driver during a WRITE operation.

Each bit line pair may be associated with a precharge circuit 150. Only one precharge circuit 150 is labeled in FIG. 2 for ease of illustration. The precharge circuit 150 may be used to charge the associated bit lines to a full supply voltage (Vcc) during a pre-charge phase of a clock (i.e., when the signal on PCH# line 155 is LOW).

Various ones of the word lines may be enabled by components within the row decoder 115. For example, the row decoder 115 may include a plurality of WL-drivers $WLD_{0-(M-1)}$, each corresponding with one of the word-lines ($WL_{0-(M-1)}$). In an evaluate phase, the pre-charge is turned OFF and one word-line ($WL_{0-(M-1)}$) may be enabled based on the row decoder 115. This is achieved by driving a selected word-line to Vcc via the corresponding WL-driver $WLD_{0-(M-1)}$. In FIG. 2, the word line WL0 is selected based on a LOW input to the WL-driver $WLD_0$. The other word lines are not enabled since the inputs to the respective WL-drivers $WLD_{1-(M-1)}$ are HIGH.

Each of the bit line pairs of the memory array 140 may be enabled by one of a plurality of column select circuits 160 (or column selectors). Only one column select circuit 160 is labeled in FIG. 2 for ease of illustration. Each column select circuit may simultaneously connect one of every eight bit line pairs $b_{0-7}$ to the corresponding SA.

Depending on the cell content, one of the selected bit lines may start dropping below Vcc thus developing a small differential voltage on the bit line pairs. The corresponding SA may amplify this small voltage into full voltage output upon arrival of the sense amplifier enable (SAE) signal.

Figure 3:
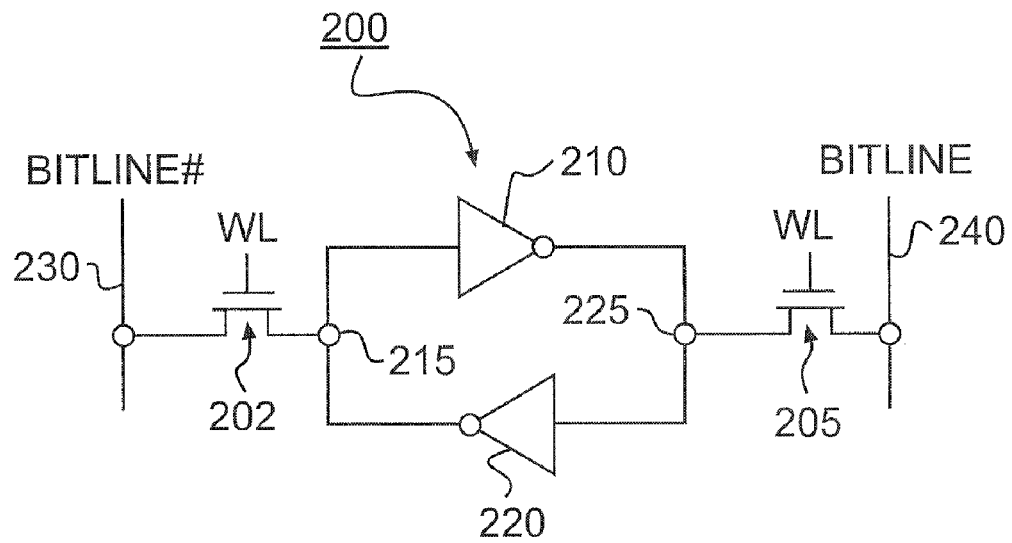
FIG. 3 is a circuit diagram of a SRAM cell according to an example arrangement.

FIG. 3 is a circuit diagram of a SRAM cell 200 (or memory cell) according to an example arrangement. Other arrangements and configurations are also possible. The SRAM cell 200 may correspond to one of the memory cells within the memory array 140 of FIG. 2. More specifically, FIG. 3 shows the SRAM cell 200 having NMOS transistors 202 and 205 coupled to a word line WL (such as WL0 in FIG. 2). The cell 200 may include two inverters 210 and 220 connected to each other in a regenerative, positive feedback circuit (also called a cross-coupled inverter configuration). The inverter 210 may include a complementary P-channel (PMOS) transistor and n-channel (NMOS) transistor having source drain paths connected in series between the chip positive DC power supply voltage VCC and GROUND. Similarly, the inverter 220 may include a complementary P-channel transistor and n-channel transistor having source drain paths connected in series between the chip positive DC power supply voltage VCC and GROUND.

A node 215 is selectively connected through the source drain path of NMOS transistor 202 to bitline# 230 (such as bitline b10# in FIG. 2), while the source drain path of NMOS transistor 205 selectively connects node 225 to bitline 240 (such as bitline b10 in FIG. 2). The word line WL drives the gate electrodes of the transistors 202 and 205 in parallel.

Figure 4:
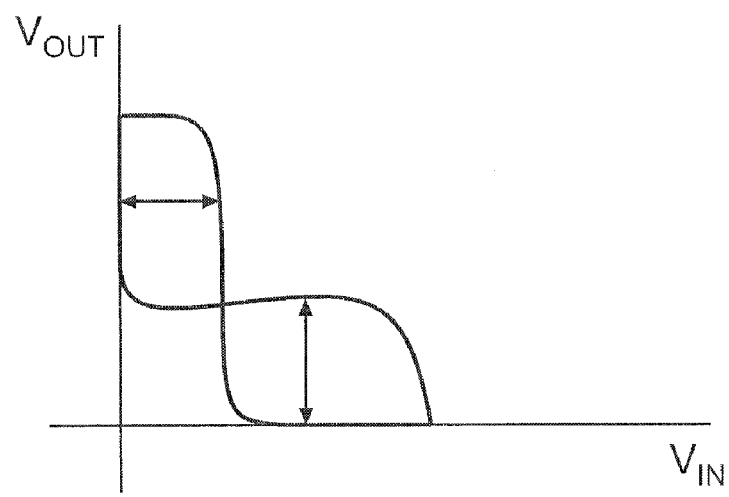
FIG. 4 is a graph showing characteristics of the SRAM cell of FIG. 3 according to an example arrangement.

FIG. 4 is a graph showing characteristics of the inverters 210 and 220 of FIG. 3 according to an example arrangement. Other arrangements, graphs and data are also possible. More specifically, FIG. 4 shows superimposed characteristics of the inverters 202 and 204 of FIG. 3. The butterfly curves shown in FIG. 3 may be used to determine a static noise margin (SNM), which is a measure of the separation between logical LOW and HIGH of an SRAM cell. The distance between the curves is the static noise margin and may be interpreted as a measure of the cell stability. The large gaps between the curves denote larger bistability. As the supply voltage gets lowered, the curves may get closer and closer together signifying that the cell is more and more unstable. In SRAMs, the inverters are typically skewed in the NMOS direction for performance since the bitlines are precharged HIGH and discharged through access and pull down NMOS devices.

SRAM devices may be provided within cache devices (such as within the cache 25 of FIG. 1). A vast majority of the cache (or SRAM devices) may be inactive during operation since banks are only accessed one row at a time. As such, the cache is a prime candidate for selective supply voltage lowering to reduce power consumption. For example, unaccessed banks may have their supply voltages reduced to significantly suppress subthreshold leakage and gate leakage. When a bank is accessed, its power supply may be raised back to the nominal value of VCC to maintain the desired performance. Clearly, the lower the supply voltage can be reduced during idle (or during a STANDBY state), the more power savings can be achieved. However, when the supply voltage is reduced (such as by the power control device 27), the distinction between a logic "0" and a logic "1" stored in the SRAM cell may become less distinct. If the supply voltage goes below a lower limit (hereafter VCCmin) the cell may be inadvertently flipped by noise into a wrong state and cached data may be corrupted. The lower limit VCCmin marks the limit of bistability of the cell, the point when logic "0" and "1" can no longer be robustly distinguished.

Figure 5:
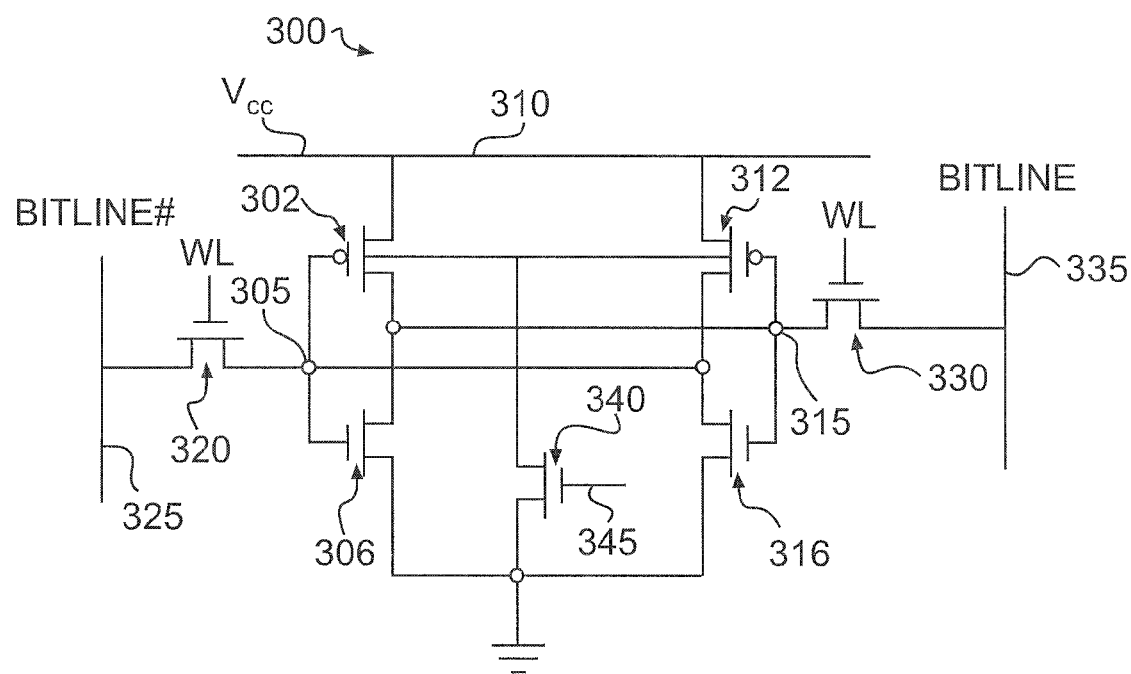
FIG. 5 is a circuit diagram of an SRAM cell according to an example embodiment of the present invention.

FIG. 5 is a circuit diagram of an SRAM cell 300 according to an example embodiment of the present invention. Other embodiments and configurations are also within the scope of the present invention. More specifically, FIG. 5 shows the SRAM cell 300 having a PMOS transistor 302 and an NMOS transistor 306 coupled between a VCC signal line 310 and GROUND. Similarly, the SRAM cell 300 includes a PMOS transistor 312 and an NMOS transistor 316 coupled between the VCC signal line 310 and GROUND. The transistors 302, 306, 312 and 316 are configured in a cross-coupled inverter configuration. The supply voltage on the VCC signal line 310 may be determined by the power control device 27. That is, the power control device 27 may change the level of the voltage based on the mode or state (ACTIVE or INACTIVE/STANDBY) of the memory device (such as the cache 25) or portions of the memory device.

FIG. 5 also shows NMOS transistors 320 and 330 coupled to a word line WL (such as WL0 in FIG. 2). A node 305 is selectively connected through the source drain path of the transistor 320 to bitline# 325 (such as bitline b10# in FIG. 2), while the source drain path of the transistor 330 selectively connects node 315 to bitline 335 (such as bitline b10 in FIG. 2). The word line WL drives the gate electrodes of the transistors 320 and 330 in parallel.

The SRAM cell 300 also includes an NMOS transistor 340 having a drain coupled to a body (i.e., an n-well) of each of the transistors 302 and 312 to apply a forward body bias based on the mode or state of the SRAM device (or based on the mode or state of the cell). The mode (such as ACTIVE or INACTIVE/STANDBY) may be determined and/or controlled by the power control device 27 based on the overall memory (or portions of the memory). A source of the transistor 340 is coupled to GROUND, and a gate of the transistor 340 is coupled to a signal line 345 that receives a signal representing a state or mode of the memory (such as a STANDBY mode) or portions of the memory, for example. The transistor 340 may operate so as to apply a forward body bias to the PMOS transistors 302 and 312 during a STANDBY mode in which the supply voltage VCC to the cache (i.e., the SRAM device) is also lowered for power savings. For example, in a STANDBY mode, the power control device 27 (shown in FIG. 1) may output a signal representing a STANDBY mode. This signal may be received at the gate of the transistor 340 along the signal line 345. This signal turns ON the transistor 340 so as to apply the forward body bias to both the transistors 302 and 312. The power control device 27 may also appropriately lower the supply voltage VCC applied to the SRAM device (such as on the signal line 310) to a supply voltage of VCCmin. This may result in greater power savings.

Applying the forward body bias makes the PMOS transistors 302 and 312 stronger because of a lower threshold voltage Vt through the body effect. As a result, the inverter characteristics are less skewed towards the NMOS side (as shown in FIG. 4) and the minimum supply voltage VCCmin is lowered thereby allowing greater power savings. Embodiments of the present invention may avoid requiring a separate body bias generator for each of the PMOS transistors 302 and 312 since the n-wells of the PMOS transistors 302 and 312, which form the PMOS bodies, are shorted to GROUND through the NMOS transistor 340 when the transistor 340 is turned ON.

FIG. 5 shows one transistor 340 coupled to the body of each of the PMOS transistors 302 and 312 of a SRAM cell. Each cell within a SRAM device may also be coupled to a similar type of NMOS transistor. Likewise, one transistor (such as the transistor 340 shown in FIG. 5) may be coupled to the PMOS transistors within a plurality of cells (e.g. across a plurality of rows and/or across a plurality of columns).

The body of the transistors 302 and 312 may be in a floating state when the transistor 340 is not turned ON by the STANDBY signal on the signal line 345. In another embodiment, another transistor (or similar device) may couple the body of the transistors 302 and 312 to the VCC signal line 310 when the memory is not in the STANDBY mode (i.e., when the transistor 340 is not turned ON).

Figure 6:
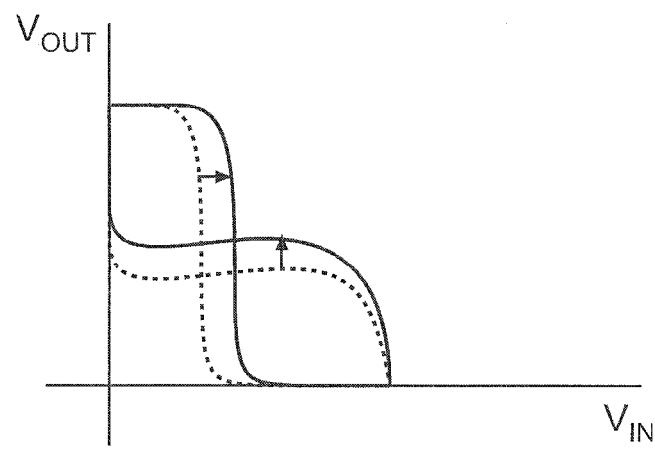
FIG. 6 is a graph showing characteristics of the SRAM cell of FIG. 5 according to an example embodiment of the present invention.

FIG. 6 is a graph showing characteristics of the SRAM cell of FIG. 5 according to an example embodiment of the present invention. Other embodiments, data and graphs are also within the scope of the present invention. More specifically, FIG. 6 shows that the static noise margin increases when the supply voltage is lowered to VCCmin and the body bias is applied to the transistor 302 and 312 of FIG. 5. For ease of illustration, the dotted lines and arrows show the enlarging of the curves, which represents the enlarging of the static noise margin. Stated differently, FIG. 6 shows that body biasing the PMOS transistors 302 and 312 unskews the inverters so that the gaps in the butterfly curves are larger, which means that the VCCmin may be lowered and more power may be saved in STANDBY mode.

Embodiments of the present invention may be provided within various electronic systems. Examples of represented systems may include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A static random access memory (SRAM) device comprising:
  a first transistor pair to couple between a supply voltage line and GROUND;
  a second transistor pair to couple between the supply voltage line and GROUND, the supply voltage line to receive a first supply voltage when the SRAM memory device is in an ACTIVE mode and to receive a second supply voltage when the SRAM memory device is in a STANDBY mode, the second supply voltage being different than the first supply voltage;
  a first access transistor to couple to a word line, a first bit line and a common node of the second transistor pair;
  a second access transistor to couple to the word line, a second bit line and a common node of the first transistor pair; and
  a bias transistor to couple to a body of one of the transistors of the first transistor pair and to a body of one of the transistors of the second transistor pair, the bias transistor to apply a forward body bias to the one transistor of the first transistor pair and to the one transistor of the second transistor pair when the SRAM memory device is in the STANDBY mode, wherein a gate of the bias transistor is coupled to a signal line to receive a STANDBY signal indicative of the STANDBY mode of the SRAM memory device.

2. The SRAM device of claim 1, wherein the bias transistor comprises an NMOS transistor having a source to couple to GROUND.

3. The SRAM device of claim 2, wherein a drain of the bias transistor is coupled to the body of the one transistor of the first transistor pair and to the body of the one transistor of the second transistor pair.

4. The SRAM device of claim 1, wherein the bias transistor to turn ON based on a STANDBY signal applied to a gate of the bias transistor.

5. The SRAM device of claim 1, wherein the one transistor of the first transistor pair comprises a PMOS transistor and the one transistor of the second transistor pair comprises another PMOS transistor.

6. The SRAM device of claim 1, wherein the supply voltage line applies-to supply the first supply voltage in the ACTIVE mode and to apply the second supply voltage in the STANDBY mode.

7. The SRAM device of claim 1, wherein the supply voltage line to provide a supply voltage to the one transistor of the first transistor pair and the one transistor of the second transistor pair in both the STANDBY mode and the ACTIVE mode.

8. The SRAM device of claim 7, further comprising a device to couple bodies of the two transistors to the supply voltage line when a memory cell of the SRAM device is not in the STANDBY mode.

9. The SRAM device of claim 1, wherein the first supply voltage and the second supply voltage are applied to a source of the one transistor of the first transistor pair and to a source of the one transistor of the second transistor pair.

10. A static random access memory (SRAM) device comprising:
  a first SRAM memory cell having a cross-coupled inverter configuration, the cross-coupled inverter configuration including at least four transistors;
  a supply voltage line to provide a first supply voltage to two transistors of the at least four transistors of the first SRAM memory cell when the first SRAM memory cell is in an ACTIVE mode and to provide a second supply voltage to the two transistors when the first SRAM memory cell is in a STANDBY mode, the second supply voltage being different than the first supply voltage; and a switching device to apply a forward body bias to the two transistors of the cross-coupled inverter configuration of the first SRAM memory cell when the first SRAM memory cell is in the STANDBY mode, wherein the switching device comprises an NMOS transistor having a source coupled to GROUND and a gate coupled to a power control unit, and wherein a gate of the NMOS transistor to receive a STANDBY signal from the power control unit indicative of the STANDBY mode of the first SRAM memory cell.

11. The SRAM device of claim 10, further comprising the power control unit to change the supply voltage on the supply voltage line based on either the ACTIVE mode or the STANDBY mode of the first SRAM memory cell.

12. The SRAM device of claim 11, wherein the power control unit further to control switching of the switching device based on either the ACTIVE mode or the STANDBY mode of the first SRAM memory cell.

13. The SRAM device of claim 10, wherein a drain of the NMOS transistor is coupled to a body of each of the two transistors of the at least four transistors of the first SRAM memory cell.

14. The SRAM device of claim 10, wherein the NMOS transistor to turn ON based on a STANDBY signal applied to the gate of the NMOS transistor.

15. The SRAM device of claim 10, further comprising a second SRAM memory cell having a cross-coupled inverter configuration, the cross-coupled inverter configuration of the second SRAM memory cell including at least four transistors, the supply voltage line to provide a supply voltage to two transistors of the at least four transistors of the second SRAM memory cell based on a mode of the second SRAM memory cell.

16. The SRAM device of claim 15, wherein the switching device to apply a forward body bias to the two transistors of the at least four transistors of the cross-coupled configuration of the second SRAM memory cell.

17. The SRAM device of claim 16, wherein the switching device to apply the forward body bias to the two transistors of the at least four transistors of the second SRAM memory cell when the second SRAM memory cell is in a STANDBY mode.

18. The SRAM device of claim 10, further comprising a device to couple bodies of the two transistors of the at least four transistors to the supply voltage line when the first SRAM memory cell is not in the STANDBY mode.

19. The SRAM device of claim 10, wherein the supply voltage line to provide the first supply voltage and the second supply voltage to sources of the two transistors of the at least four transistors of the first SRAM memory cell.

20. An electronic system comprising:
a processor device to process data;
a static random access memory (SRAM) device to store the data; and
a power control unit to control a supply voltage level applied to the SRAM device and to provide a signal indicative of a mode of the SRAM device, the power control unit to apply a first voltage level when the signal indicates that the SRAM device is in an ACTIVE mode and to apply a second voltage level when the signal indicates that the SRAM device is in a STANDBY mode, the SRAM device including:
a switching device to apply a forward bias to transistors within the SRAM device when the signal provided by the power control unit indicates the STANDBY mode of the SRAM device.

21. The electronic system of claim 20, wherein the switching device to apply the forward body bias by coupling a body of each of the transistors to GROUND.

22. The electronic system of claim 20, wherein applying the forward bias to the transistors increases a static noise margin.

23. The electronic system of claim 20, wherein the power control unit to provide the supply voltage level to two transistors of the SRAM device in both the STANDBY mode and the ACTIVE mode.

24. The electronic system of claim 23, wherein the SRAM device further including a device to couple bodies of the two transistors of a memory cell in the SRAM device to a supply voltage line when the memory cell is not in the STANDBY mode.

25. The electronic system of claim 20, wherein the power control unit to apply the first voltage level and the second voltage level to sources of transistors within the SPAM device.

* * * * *